(12) United States Patent
Radomski et al.

(10) Patent No.: US 9,041,480 B2
(45) Date of Patent: May 26, 2015

(54) VIRTUAL RF SENSOR

(71) Applicant: MKS Instruments, Inc., Andover, MA (US)

(72) Inventors: Aaron T. Radomski, Wyoming, NY (US); Dennis M. Brown, Pittsford, NY (US); Nicholas Nelson, East Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 294 days.

(21) Appl. No.: 13/832,901

(22) Filed: Mar. 15, 2013

(65) Prior Publication Data

US 2014/0266492 A1    Sep. 18, 2014

(51) Int. Cl.
*H03H 7/40* (2006.01)

(52) U.S. Cl.
CPC ........................ *H03H 7/40* (2013.01)

(58) Field of Classification Search
CPC ........................................... H03H 7/40
USPC .................................. 333/17.3, 32
See application file for complete search history.

(56) References Cited

U.S. PATENT DOCUMENTS 5,187,454 A * 2/1993 Collins et al. ................ 333/17.3
5,585,766 A * 12/1996 Shel ............................. 333/17.3

* cited by examiner

*Primary Examiner* — Stephen E Jones
*Assistant Examiner* — Scott S Outten
(74) *Attorney, Agent, or Firm* — Harness, Dickey & Pierce, P.L.C.

(57) ABSTRACT

A radio frequency (RF) generation system includes an impedance determination module that receives an RF voltage and an RF current. The impedance determination module further determines an RF generator impedance based on the RF voltage and the RF current. The RF generation system also includes a control module that determines a plurality of electrical values based on the RF generator impedance. The matching module further matches an impedance of a load based on the RF generator impedance and the plurality of electrical components. The matching module also determines a 2 port transfer function based on the plurality of electrical values. The RF generation system also includes a virtual sensor module that estimates a load voltage, a load current, and a load impedance based on the RF voltage, the RF generator, the RF generator impedance, and the 2 port transfer function.

20 Claims, 4 Drawing Sheets

VIRTUAL RF SENSOR

FIELD

The present disclosure relates to RF power systems and more specifically to virtual RF sensors of an RF power system.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in, for example only, semiconductor fabrication. In plasma etching, ions are accelerated by an electric field to etch exposed surfaces on a substrate. The electric field is generated according to RF power signals generated by a radio frequency (RF) generator of an RF power system. The RF power signals generated by the RF generator are precisely controlled to effectively perform the plasma etching. Plasma can also be used for deposition of thin films. In one example, a sputtering process can deposit metals or insulators using a target of the material to be deposited. Deposition can also be affected using plasma enhanced chemical vapor deposition for semiconductor materials such as amorphous silicon and dielectrics such as silicon nitride. In each case, the plasma electrical parameters must be monitored and controlled for optimum throughput and process repeatability.

An RF sensor placed at the plasma can be expensive or impractical to realize due to the highly reactive nature of the load. Temperature variations at the plasma chamber can also make it very difficult to realize an accurate RF sensor at the plasma load. Finally, the high RF noise content at the plasma can make it very difficult to transmit high speed, real-time measurements of the plasma RF parameters to an external control or monitoring system.

An RF power system may include an RF generator, a matching network, and a load, such as a plasma chamber. The RF power signals are used to drive the load to fabricate various components including, but not limited to, integrated circuits (ICs), solar panels, flat panel displays (FPD), compact disks (CDs), and/or digital versatile (or video) discs (DVDs). The load may include any of a number of elements or devices driven by an RF signal, including, but not limited to, the plasma chamber.

The RF power signals are received at the matching network. The matching network matches an input impedance of the matching network to a characteristic impedance of a transmission line between the RF generator and the matching network. This impedance matching aids in maximizing an amount of power applied to the matching network in a forward direction toward the plasma chamber ("forward power") and minimizing the reflected power back from the matching network to the RF generator ("reverse power"). Impedance matching also assists in maximizing forward power output from the matching network to the plasma chamber.

The RF power system may also include a virtual sensor arranged to estimate load characteristics in a high-speed, real-time fashion. For example, the virtual sensor may determine a load voltage and a load current based on a mathematical relationship between known electrical characteristics of the RF power system.

SUMMARY

A radio frequency (RF) generation system includes an impedance determination module that receives an RF voltage and an RF current. The impedance determination module further determines an RF generator impedance based on the RF voltage and the RF current. The RF generation system also includes a control module that determines a plurality of electrical values based on the RF generator impedance. The RF generation system further includes a matching module that selectively adjusts a plurality of electrical components based on the plurality of electrical values. The matching module further matches an impedance of a load based on the RF generator impedance and the plurality of electrical components.

Alternatively, the matching module may match the impedance of a load based on a plurality of fixed value electrical parameters. The matching module also determines a 2 port transfer function based on the plurality of electrical values. Alternatively, the matching module may determine a lookup a predetermined 2 port transfer function corresponding to a plurality of fixed value electrical parameters. The RF generation system also includes a virtual sensor module that estimates a load voltage, a load current, and a load impedance based on the RF generator voltage, the RF generator current, the RF generator impedance, and the 2 port transfer function.

In other features, a method includes receiving an RF voltage and an RF current. The method further includes determining an RF generator impedance based on the RF voltage and the RF current. The method also includes determining a plurality of electrical values based on the RF generator impedance. The method also includes selectively adjusting a plurality of electrical components based on the plurality of electrical values and matching an impedance of a load based on the RF generator impedance and the electrical components. The method also includes determining a 2 port transfer function based on the plurality of electrical values. The method further includes estimating a load voltage, a load current, and a load impedance based on the RF voltage, the RF current, the RF generator impedance, and the 2 port transfer function.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

An RF power system may include an RF generator, a matching network, and a load, such as a plasma chamber. The RF power signals are used to drive the load to fabricate various components including, but not limited to, integrated circuits (ICs), solar panels, flat panel displays (FPD), compact disks (CDs), and/or digital versatile (or video) discs (DVDs). The load may include any of a number of elements or devices driven by an RF signal, including, but not limited to, the plasma chamber.

The RF power signals are received at the matching network. The matching network matches an input impedance of the matching network to a characteristic impedance of a transmission line between the RF generator and the matching network. This impedance matching aids in maximizing an amount of power applied to the matching network in a forward direction toward the plasma chamber ("forward power") and minimizing the power reflected back from the matching network to the RF generator ("reverse power"). Impedance matching also assists in maximizing forward power output from the matching network to the plasma chamber.

Figure 1:
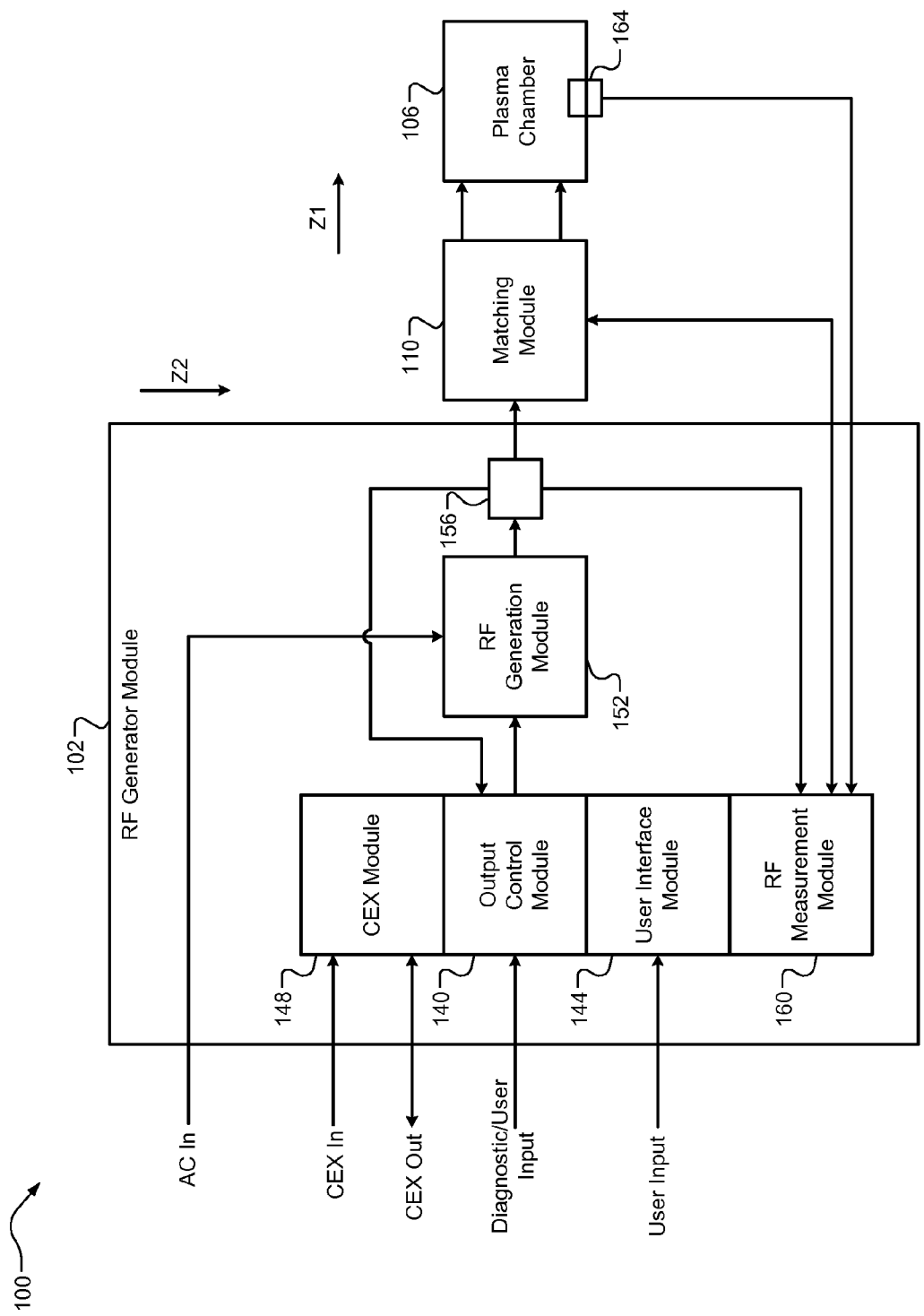
FIG. 1 is a functional block diagram of an exemplary radio frequency (RF) plasma chamber system according to the principles of the present disclosure.

Referring now to FIG. 1, a functional block diagram of an exemplary implementation of an exemplary radio frequency (RF) plasma chamber system 100 is presented. While FIG. 1 illustrates a single-channel RF plasma chamber system, the principles of the present disclosure apply to RF generator systems including one or more channels.

An RF generator module 102 (e.g., an RF generator) receives alternating current (AC) input power and generates at least one RF output using the AC input power. For example only, the AC input power may be three-phase AC power of approximately 480 Volts AC (VAC) or another suitable voltage. For purposes of discussion only, the RF generator module 102 will be hereafter discussed as generating one RF output. However, the RF generator module 102 may generate a greater number of RF outputs, or may only generate a single RF output. For example only, the RF generator module 102 may generate one RF output per plasma electrode implemented in one or more plasma chambers, such as plasma chamber 106.

A matching module 110 receives the RF output and impedance matches the RF output before providing the RF output to the plasma chamber 106. The RF generator module 102 may control the matching module 110. More specifically, the RF generator module 102 may control the extent to which the matching module 110 performs impedance matching. The matching module 110 impedance matches the RF output based on a 2 port transfer function (Mm).

For example, the matching module 110 may determine a matrix Mm by direct measurement of the matching network using a 2 port vector network analyzer to obtain an array of 2 port S-parameters versus frequency. The S-parameters may then be transformed into ABCD (chain matrix) parameters by utilizing industry known conversion equations. In another example, the matching module 110 may determine the matrix Mm analytically by determining the 2 port transfer functions of the constituent components followed by multiplication of the components to determine a composite 2 port ABCD parameter matrix versus frequency.

The matching module 110 applies the RF output to a plasma electrode, respectively, implemented within the plasma chamber 106. Application of the RF output to the plasma electrode may be performed, for example, in thin film deposition systems, thin film etching systems, and in other suitable systems.

The RF generator module 102 may include an output control module 140, a user interface module 144, a common excitation (CEX) module 148, and an RF generation module 152. The RF generator module 102 may also include a sensor module 156.

The output control module 140 receives an input power setpoint for the RF outputs that are generated by the RF generation module 152 (P Set) and that is delivered to the plasma electrode. The input power setpoint may be provided by, for example, the user interface module 144 or another suitable source. Another suitable source of the input power setpoint may include, for example, a diagnostic or user input provided via a universal standard (US) 232 connection, via an ethernet connection, via a wireless connection, or via a front panel input.

The sensor module 156 may measure voltage and current or forward and reflected power of the RF output generated by the RF generation module 152. The sensor module 156 may provide signals indicating the voltage and current, respectively, to the output control module 140. For example only, the sensor module 156 may include a directional coupler or VI probe, or another suitable type of sensor. In other implementations, the sensor module 156 may output signals indicative of forward and reverse power with the RF output. A forward power may refer to an amount of power leaving the RF generator module 152. A reverse power may refer to an amount of power reflected back to the RF generator module 152. The output of the sensor module 156 may be referred to as a feedback signal. The feedback signal may be a digital signal or an analog signal.

Based on the feedback signal from the sensor module 156, the output control module 140 may determine a forward power for the RF output. The output control module 140 may also determine a reflection coefficient based on the feedback signal output by the sensor module 156.

The output control module 140 controls the generation of the first and second RF outputs using a feedback approach based on the first and second forward powers and the first and second reflection coefficients, respectively. More specifically, the output control module 140 provides one or more rail voltage setpoints and/or one or more driver control signals to the RF generation module 152. The RF generation module 152 controls one or more rail voltages (i.e., voltages output from the RF generation module 152 and input to power amplifiers) based on the rail voltage setpoints and controls driving of power amplifiers based on the driver control signals.

In some embodiments, the RF generator module 102 controls the matching module 110 based on a determined impedance generated by the RF generation module 152. For example, the RF generator module 102 may include a RF measurement module 160. The RF measurement module 160 determines an impedance (for example Z1 as shown in FIG. 1) generated by the RF generation module 152. The RF measurement module 160 receives a measured voltage and a measured current from the sensor module 156. The RF measurement module 160 determines the impedance based on a ratio of the measured voltage to the measured current generated by the RF generation module 152.

The matching module 110 controls a plurality of electrical characteristics of the system 100 in order to match the impedance Z1. The matching module 110 may control a plurality of capacitance, inductance, and resistance values of the system 100 in order to match the impedance Z1. In this way, the matching module 110 matches Z1 (as shown in FIG. 1) to Z2.

The matching module 110 then communicates the adjusted plurality of electrical characteristics (represented by the 2 port transfer function Mm) to the RF measurement module 160. In another embodiment, the matching module 110 impedance match the impedance Z1 based on a plurality of fixed value electrical components.

The RF measurement module 160 may also determine a plurality of electrical characteristics of the plasma chamber 106, for example, a load voltage and a load current of the plasma chamber 106. The plasma chamber 106 may include a plasma chamber sensor 164. The plasma chamber sensor 164 may measure voltage and current of the plasma chamber 106. The plasma chamber sensor 164 may provide signals indicating the voltage and current, respectively, to the RF measurement module 160. For example only, the plasma chamber sensor 164 may include a directional coupler or VI probe, or another suitable type of sensor.

In another embodiment, the RF measurement module 160 virtually senses the load voltage and the load current of the plasma chamber 106. For example, the RF measurement module 160 estimates the load voltage and the load current based on a mathematical relationship between the measured RF voltage, the measured RF current, a calculated generator impedance Z1, and a 2 port matching network transfer function Mm.

Figure 2:
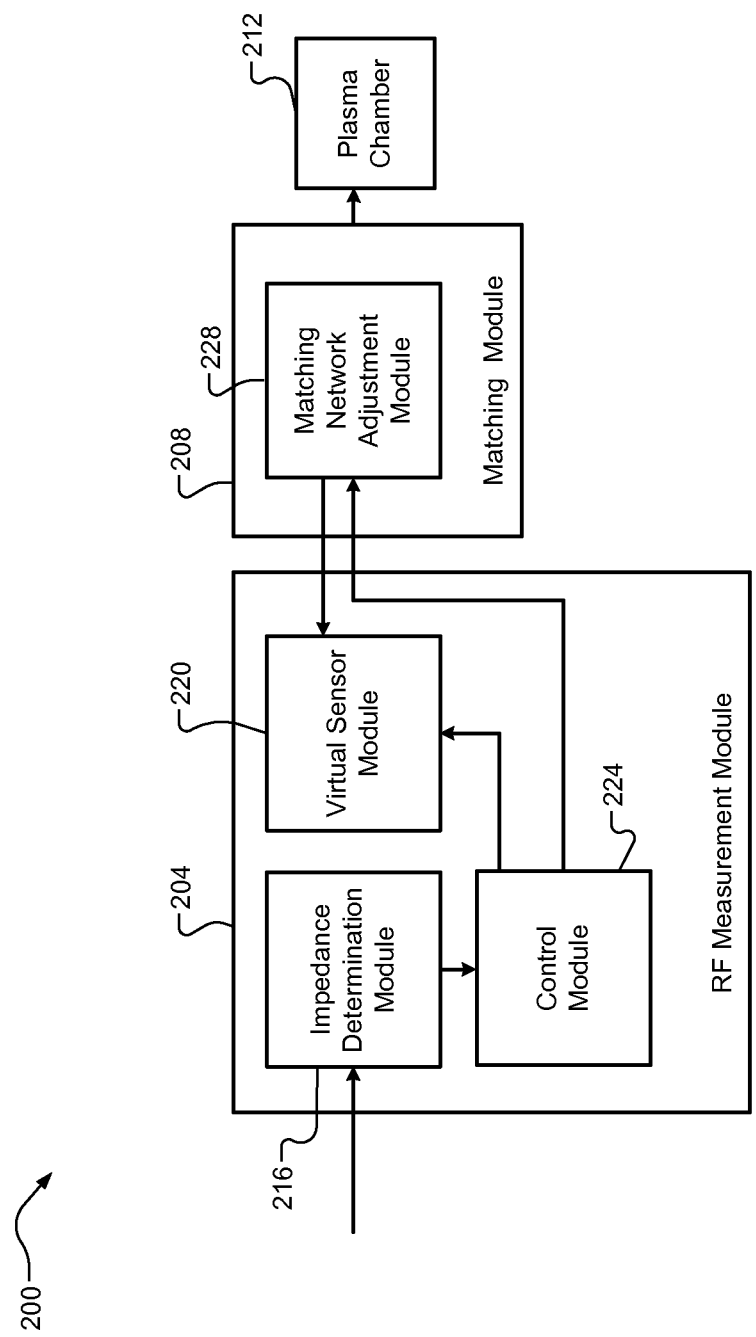
FIG. 2 is a functional block diagram of a virtual RF sensor system according to the principles of the present disclosure.

Referring now to FIG. 2, a functional block diagram of a virtual RF sensor system 200 is presented. The virtual RF sensor system 200 includes a RF measurement module 204, a matching module 208, and a plasma chamber 212. The RF measurement module 204 includes an impedance determination module 216, a virtual sensor module 220, and a control module 224. The impedance determination module 216 determines an RF generator impedance. For example, the impedance determination module 216 receives a measured voltage (V1) and a measured current (I1) from the sensor module 156 (FIG. 1).

The impedance determination module 216 calculates the RF generator impedance based on a ratio of V1 to I1. In some implementations, the impedance determination module 216 may determine the RF generator impedance based on the forward and reflected signals from a directional coupler. In other implementations, the impedance determination module 216 may determine the RF generator impedance based on the voltage and current signals from a V-I sensor. The impedance determination module 216 determines the RF generator impedance by determining which of the RF generator impedances correlate to V1 and I1. The impedance determination module 216 then communicates the RF generator impedance, V1, and I1 to a control module 224.

The control module 224 controls the matching module 208 based on the RF generator impedance. The control module 224 instructs the matching module 208 to match the RF generator impedance by adjusting a plurality of electrical characteristics. The plurality of electrical characteristics may include capacitance, inductance, and resistance values. The control module 224 may also receive the 2 port transfer function described mathematically as the matrix Mm.

The matching module 208 includes a matching network adjustment module 228. The matching network adjustment module 228 controls a plurality of variable capacitors, a plurality of variable inductors, and a plurality of variable resistors within the system 100. The control module 224 determines a capacitance value, and inductance value, and a resistance value required to achieve an impedance that matches the RF generator impedance. The control module 224 communicates the capacitance value, the inductance value, the resistance value, and the RF impedance to the virtual sensor module 220 and the matching network adjustment module 228.

The matching network adjustment module 228 selectively varies each of the plurality of variable capacitors, the plurality of variable inductors, and the plurality of variable resistors in order to achieve the capacitance value, the inductance value, and the resistance value. In this way, the matching network adjustment module 228 adjusts electrical characteristics of the system 100 in order to impedance match the RF generator impedance.

Figure 4:
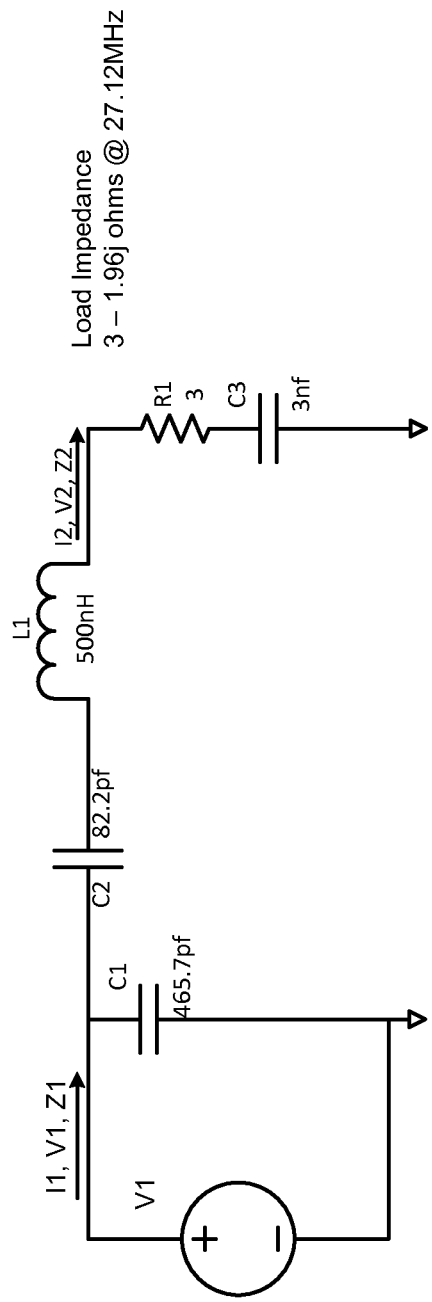
FIG. 4 is an example matching network circuit according to the principles of the present disclosure.

The matching impedance may be a complex number. For example, as illustrated in the matching network circuit in FIG. 4, when the plasma load impedance is approximately 3−j1.95 at 27.12 MHz, the RF generator impedance is matched to approximately 50 ohms. Where j represents the complex part of the matching impedance value. For example, j equals the square root of −1. The matching network adjustment module 228 communicates the 2 port transfer function matrix, $M_m$ to the virtual sensor module 220. The corresponding ABCD chain parameter matrix at 27.12 MHz Mm is:

$$M_m = \begin{bmatrix} A & B \\ C & D \end{bmatrix} = \begin{bmatrix} 1+j0 & 0+j13.8 \\ 0+j0.0794 & 0.0956+j0 \end{bmatrix}$$

The virtual sensor module 220 is configured to estimate a plasma chamber voltage (V2) and a plasma chamber current (I2) based on the RF generator impedance and each of the capacitance value, the inductance value, and the resistance value as expressed by matrix $M_m$. The virtual sensor module 220 estimates V2, I2, and Z2 based on a mathematical relationship between the matching impedance, V1, I1, the matrix $M_m$.

For example, each of the capacitance value, the inductance value, and the resistance value may represent a segment in a transmission line between the RF measurement module 204 and the plasma chamber 212. Each segment of the transmission line may be modeled as an ABCD matrix. An ABCD matrix is a 2×2 matrix that represents the transformation of voltage and current between the RF measurement module 204 and the plasma chamber 212. In one implementation the capacitance value may be represented by a capacitance ABCD matrix (MA), the inductance value may be represented by an inductance ABCD matrix (MB), and the resistance value may be represented by a resistance ABCD matrix (MC). For example, the inductance value represents one of the segments of the transmission line, and has an ABCD matrix, $M_B$ of:

$$M_B = \begin{bmatrix} 1 & j2\pi fL \\ 0 & 1 \end{bmatrix}$$

In the above example, j is the square root of −1, f is an operating frequency of the system 100 in Hertz (Hz), and L is the inductance value in Henries. The virtual sensor module 220 calculates a total ABCD matrix ($M_{total}$) based on $M_A$, $M_B$, and $M_C$. For example, $M_{total}$ is the result of multiplying $M_A$, $M_B$, and $M_C$ as shown below:

$$M_{total} = M_A \times M_B \times M_C$$

The virtual sensor module 220 determines V2 and I2 based on a mathematical simplification of the above equation given by:

$$\begin{bmatrix} V1 \\ I1 \end{bmatrix} = \begin{bmatrix} A & B \\ C & D \end{bmatrix} \times \begin{bmatrix} V2 \\ I2 \end{bmatrix}$$

Or, equivalently the above equation may be given by the following two equations:

$$V1 = A*V2 + B*I2$$

$$I1 = C*V2 + D*I2$$

In general, each of the variables in the above equations represents values that are complex quantities with a real part and an imaginary part. The real part represents magnitude and the imaginary part represents phase shift. The virtual sensor module 212 estimates V2 and I2 based on V1, I1, and the inverse of $M_{total}$. The virtual sensor module 212 estimates V2 and I2 based on the following equations:

$$\begin{bmatrix} V2 \\ I2 \end{bmatrix} = M_{total}^{-1} \times \begin{bmatrix} V1 \\ I1 \end{bmatrix}$$

In another implementation, the inverse of $M_{total}$ may be a predetermined value stored in a look-up table. The virtual sensor module 212 estimates V2 and I2 based V1, I1, and a predetermined inverse of $M_{total}$. The virtual sensor module 212 may use the predetermined inverse of $M_{total}$ in order to reduce the amount of time it takes to estimate V2 and I2. In this way, the virtual sensor module 212 may use the estimated V2 and I2 for real-time operations such as plasma power control, arc detection, plasma ignition analysis, power loss measurements, and prediction of load characteristics, for example.

Figure 3:
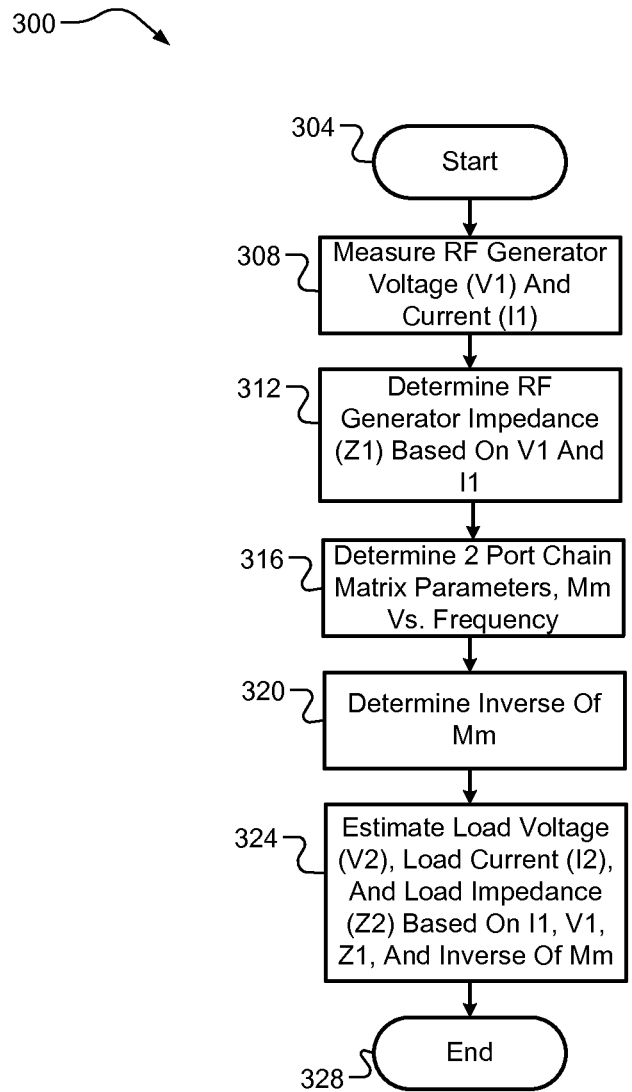
FIG. 3 is a flow diagram illustrating a load voltage and load current estimation method according to the principles of the present disclosure.

Referring now to FIG. 3, a voltage and current estimation method 300 begins at 304. At 308, the method 300 measures voltage (V1) and current (I1) generated by a radio frequency (RF) generator. At 312, the method 300 determines an RF generator impedance (Z1) based on a ratio of V1 and I1. At 316, the method 300 determines the 2 port chain matrix parameters, $M_m$ versus frequency. At 320, the method 300 determines the inverse of $M_m$. At 324, the method 300 estimates a load voltage, a load current, and a load impedance based on a mathematical relationship between I1, V1, Z1, and the inverse of $M_m$. The method 300 ends at 328.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

As used herein, the term module may refer to, be part of, or include an Application Specific Integrated Circuit (ASIC); an electronic circuit; a combinational logic circuit; a field programmable gate array (FPGA); a processor (shared, dedicated, or group) that executes code; other suitable hardware components that provide the described functionality; or a combination of some or all of the above, such as in a system-on-chip. The term module may include memory (shared, dedicated, or group) that stores code executed by the processor.

The term code, as used above, may include software, firmware, and/or microcode, and may refer to programs, routines, functions, classes, and/or objects. The term shared, as used above, means that some or all code from multiple modules may be executed using a single (shared) processor. In addition, some or all code from multiple modules may be stored by a single (shared) memory. The term group, as used above, means that some or all code from a single module may be executed using a group of processors. In addition, some or all code from a single module may be stored using a group of memories.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

What is claimed is:

1. A radio frequency (RF) generation system, comprising:
    an impedance determination module that receives an RF voltage and an RF current and that determines an RF generator impedance based on the RF voltage and the RF current;
    a control module that determines a plurality of electrical values based on the RF generator impedance;
    a matching module that:
        matches an impedance of a load based on the RF generator impedance and the plurality of electrical values; and
        determines a 2 port transfer function based on the plurality of electrical values; and
    a virtual sensor module that estimates a load voltage, a load current, and a load impedance based on the RF voltage, the RF current, the RF generator impedance, and the 2 port transfer function.

2. The RF generation system of claim 1 wherein the matching module selectively adjusts a plurality of electrical components based on the plurality of electrical values and wherein the plurality of electrical components includes a capacitance value, an inductance value, and a resistance value, wherein the capacitance value, the inductance value, and the resistance value are represented by an ABCD matrix.

3. The RF generation system of claim 2 wherein the plurality of electrical components includes a plurality of capacitors, a plurality of inductors, and a plurality of resistors.

4. The RF generation system of claim 1 wherein the virtual sensor module determines an ABCD matrix for each of the plurality of electrical values and determines an total ABCD matrix based on each of the ABCD matrices of each of the plurality of electrical values.

5. The RF generation system of claim 4 wherein the virtual sensor module estimates the load voltage and the load current based on a relationship between an inverse of the total ABCD matrix, the RF voltage, and the RF current.

6. The RF generation system of claim 1 wherein the RF generator impedance is a predetermined value.

7. The RF generation system of claim 1 wherein the virtual sensor module estimates the load voltage and load current based on a mathematical relationship between the RF voltage, the RF current, the RF generator impedance, and the 2 port transfer function.

8. The RF generation system of claim 1 further comprising a sensor module that measures the RF voltage and the RF current.

9. The RF generation system of claim 1 wherein the impedance determination module determines the RF generator impedance based on a ratio of the RF voltage to the RF current.

10. the RF generation system of claim 1 wherein the 2 port transfer function is a predetermined value.

11. A radio frequency (RF) generation method, comprising:
   receiving an RF voltage and an RF current;
   determining an RF generator impedance based on the RF voltage and the RF current;
   determining a plurality of electrical values based on the RF generator impedance;
   selectively adjusting a plurality of electrical components based on the plurality of electrical values;
   matching an impedance of a load based on the RF generator impedance and the electrical components;
   determining a 2 port transfer function based on the plurality of electrical values; and
   estimating a load voltage, a load current, and a load impedance based on the RF voltage, the RF current, the RF generator impedance, and the 2 port transfer function.

12. The RF generation method of claim 11 further comprising determining an ABCD matrix for each of the plurality of electrical values and determining an total ABCD matrix based on each of the ABCD matrices of each of the plurality of electrical values.

13. The RF generation method of claim 12 further comprising estimating the load voltage and the load current based on a relationship between an inverse of the total ABCD matrix, the RF voltage, and the RF current.

14. The RF generation method of claim 11 wherein the RF generator impedance is a predetermined value.

15. The RF generation method of claim 11 wherein the plurality of electrical components includes a capacitance value, an inductance value, and a resistance value and wherein the capacitance value, the inductance value, and the resistance value are represented by an ABCD matrix.

16. The RF generation method of claim 11 further comprising estimating the load voltage and load current based on a mathematical relationship between the RF voltage, the RF current, the RF generator impedance, and the 2 port transfer function.

17. The RF generation method of claim 11 wherein the plurality of electrical components includes a plurality of capacitors, a plurality of inductors, and a plurality of resistors.

18. The RF generation method of claim 11 further comprising measuring the RF voltage and the RF current.

19. The RF generation method of claim 11 further comprising determining the RF generator impedance based on a ratio of the RF voltage to the RF current.

20. The RF generation method of claim 11 wherein the 2 port transfer function is a predetermined value.

* * * * *